United States Patent
Schuster et al.

(10) Patent No.: US 8,192,786 B2
(45) Date of Patent: Jun. 5, 2012

(54) METHOD TO ENSURE THE REMOVABILITY AND/OR THE MOBILITY OF AN ELEMENT CAST IN A SEALING COMPOUND

(75) Inventors: Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 1177 days.

(21) Appl. No.: 12/015,072

(22) Filed: Jan. 16, 2008

(65) Prior Publication Data

US 2008/0175978 A1    Jul. 24, 2008

(30) Foreign Application Priority Data

Jan. 16, 2007   (DE) .......................... 10 2007 002 195

(51) Int. Cl.
 *B01D 1/00*    (2006.01)
(52) U.S. Cl. .................................. 427/2.13; 427/385.5
(58) Field of Classification Search ................. 427/2.13, 427/385.5
See application file for complete search history.

(56) References Cited

U.S. PATENT DOCUMENTS 3,860,311 A * 1/1975 Shernoff et al. ................ 445/73

FOREIGN PATENT DOCUMENTS

| DE | 86 489 | 12/1971 |
| DE | 38 03 093 A1 | 8/1989 |
| DE | 197 22 211 A1 | 8/1998 |
| DE | 10 2004 039 172 B3 | 12/2005 |

* cited by examiner

*Primary Examiner* — Robert D. Harlan
(74) *Attorney, Agent, or Firm* — Schiff Hardin LLP

(57) ABSTRACT

In a method to ensure the removability and/or the mobility of at least one element cast in a casting compound for a module of a medical apparatus, wherein the element is coated with a meltable substance before the casting, the meltable substance is melted by heating after the casting in order to remove and/or to produce the mobility of the element.

19 Claims, 2 Drawing Sheets

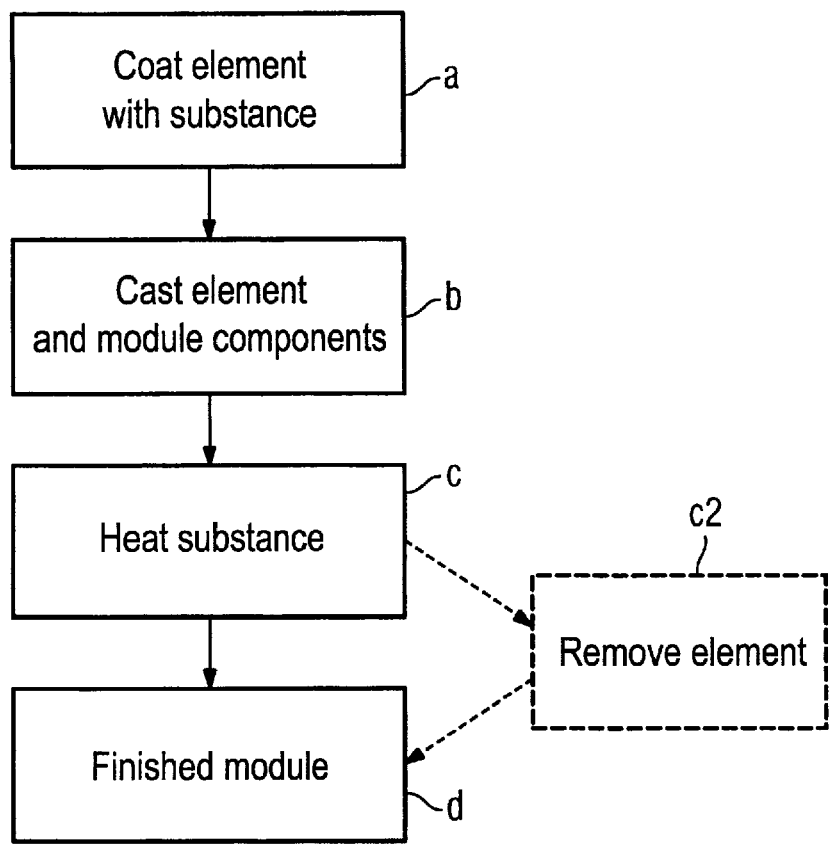
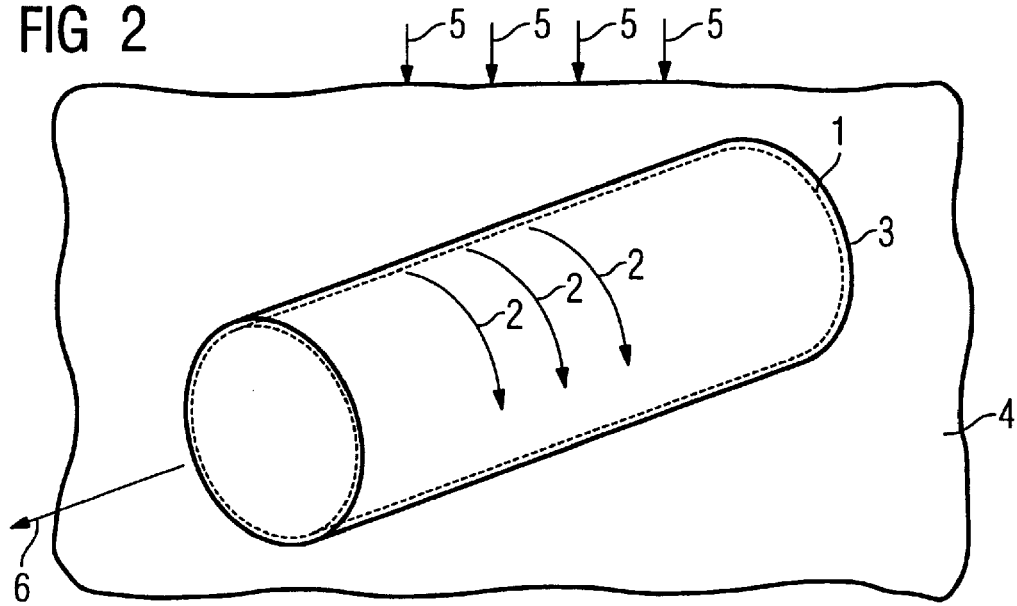

US 8,192,786 B2

METHOD TO ENSURE THE REMOVABILITY AND/OR THE MOBILITY OF AN ELEMENT CAST IN A SEALING COMPOUND

BACKGROUND OF THE INVENTION

1. Field of the Invention

The present invention concerns a method to ensure the removability and/or the mobility of at least one element cast in a casting compound in a module of a medical apparatus, in particular a gradient coil of a magnetic resonance apparatus.

2. Description of the Prior Art

In many medical apparatuses (such as magnetic resonance examination scanners) specific components or modules are encapsulated (cast) or impregnated with an epoxy-based resin in order to achieve electrical insulation and mechanical stabilization. Furthermore, the encapsulation allows heat to be dissipated and ensures a greater protection against environmental influences.

Examples of such encapsulated components are the gradient coils in magnetic resonance scanners. These gradient coils are essentially three-axis magnetic field coils that are encapsulated in a resin matrix (which is most often a matrix made from epoxy resin) in order to generate or to ensure the desired mechanical and electrical properties of these coils. For example, in the case of cylindrical gradient coils, the construction of the coil arrangement ensues on a likewise cylindrical metallic mandrel.

Furthermore, for shaping of an external contour of a medical apparatus or to enable through-holes and openings, it is typical to cast metallic shaped parts that are subsequently ejected from the casting compound after curing.

To enable or to ensure the removal of these shaped parts or of the mandrel for the coil construction and similar elements, care must be taken that these elements do not permanently adhere with the casting compound surrounding them.

In addition, there are modules for which a certain mobility must be ensured such as, for example, mounting devices for insert gradient coils in magnetic resonance devices. Roller bodies whose rotation capability must be ensured in spite of an encapsulation are used for the installation or altering for the position of such coils.

Such casting parts (such as, for example, the cylindrical mandrel for the coil construction) have conventionally been treated with a separation means (for example made of silicon) in order to avoid an adhesion to the surrounding casting compound. It is additionally possible to wrap the corresponding elements that are to be cast in the casting compound with a separator foil that is subsequently closely masked.

What are known as draft bevels or chamfers are additionally provided at the cast elements that, however, lead to the situation that a deviation from the ideal geometric shape that must be accepted.

For example, this means that a cylindrical mandrel for a cylindrical coil design can deviate from the ideal cylindrical shape by a few millimeters given a length of approximately 1.50 m.

Profile rods made from aluminum with an approximately rectangular cross-section are integrated into the coil construction in a similar manner and are ejected again after the curing of the casting compound. In this case as well the aluminum surface is treated with a silicone separation means and draft bevels are additionally provided, wherein the cited problems with regard to a deviation from a desired, exact shape result.

A method as well as a device for production of an actively shielded gradient coil arrangement for a magnetic resonance apparatus are known from DE 197 22 211 (A1), in which (among other things) mold cores are mounted that are removed again after a casting and curing of a casting material. These mold cores can likewise comprise aluminum and are if applicable wetted with a separation means such as silicone oil so that they can be easily removed after curing of the cast.

DD 86 489 concerns a mold core for production of hollow bodies or shaped parts made from reinforced, curable plastic resins, wherein mold cores treated with meltable separation means as already known are described. Such mold cores enable a removal from the mold with a comparably small force expenditure after the melting out of the separation means, but require a protracted and elaborate separation means treatment.

SUMMARY OF THE INVENTION

An object of the present invention is to provide a method that ensures the removability or the mobility of an element cast in a casting compound in a medical apparatus that avoids or at least alleviate a problem of that type described above.

This object is achieved in accordance with the invention by a method of the aforementioned type, wherein the element is coated with a meltable substance before the casting, and wherein meltable substance is melted by heating after the casting in order to remove the element or to produce the mobility of the element.

According to the invention, cast parts in medical apparatuses whose mobility must be ensured, or that must be removed again from a casting compound after curing, are coated with a thin coating made of a meltable substance. After curing of the cast, or after the encapsulation, the encapsulated shaped parts or movable parts are heated, or only a region of the applied meltable substance is heated, in order to thus melt the coating. It is thereby enabled to eject or to draw out the casting part subsequently to or simultaneously with the heating.

In the event that, for example, roller bodies are encapsulated whose mobility must be ensured, the coating produces a lower roll resistance between the roller bodies and the associated medium. Due to the melting of the coating, a gap that enables such rolling arises between the roller body and the cast.

For the method to ensure the removability and/or the mobility of the cast element, the conventional draft bevels (which can lead to imprecisions in the construction or can at least lead to the acquisition quality of a magnetic resonance system or the functionality of another medical apparatus being impaired) can be omitted.

The melted substance spreads as a fluid in the arising gap and, for example, can drain or be drawn off via the open side serving for the removal of the element.

With the described method to produce a component of a medical apparatus or to ensure the removability or mobility of elements cast in a casting compound, a component such as a gradient coil system can be produced without having to accept the reduction of the precision that can arise, for example, by the provision of draft bevels in encapsulated elements that must be removed again later.

According to the invention, the element can be an element encapsulated in a resin matrix (in particular in a resin matrix surrounding a coil arrangement of a magnetic resonance apparatus) can be coated with the meltable substance. For example, before the casting the cylindrical metallic mandrel for construction of a gradient coil system is coated with the meltable substance in order to melt the casting after the casting and the curing of the casting compound, so that the mandrel (which serves only for the coil construction) can be removed again. Upon the melting of the substance, a gap arises between the substance and the casting compound that enables the casting part, which is no longer required for the finished module, to be removed without the application of a large force.

The element can be a shaped part or a roller body coated with the meltable substance. A typical shaped part is the coil mandrel for construction of the gradient coils. Other example of elements are shim cores that are used in the framework of the correction of the magnetic field (shimming) as well as profile parts with specific cross-sections that serve to support, for example, the coil structure of a magnetic resonance apparatus.

For example, roller bodies are important in connection with the transport or, respectively, the installation of a specific component of a medical module. Examples, gradient coils that are to be inserted into the body of the magnetic resonance device during the installation and gradient coils fashioned as (local) insert coils, for which mobility must be ensured in order to correctly position them as needed. Rollers or roller bodies are used for this purpose. Such roller bodies can advantageously be encapsulated in a casting compound after they have initially been coated with a meltable coating (which can be a specific chemical substance such as a wax or other material). The meltable substance is subsequently melted and drawn off in order to enable the mobility of the roller body due to the arising gap.

As already stated, a mandrel for a coil construction and/or a shim core and/or a profile rod as (in particular metallic) shaped parts and/or a roller body for an insert gradient coil can be coated with the meltable substance. The removability of the shaped parts or the mobility of the roller bodies is ensured after the melting of the substance after the curing of the cast. Gradient coils and other components thus can be designed with geometric precision in the framework of their manufacture or the manufacture of a medical apparatus, with the positive fit (fastener-free) encapsulated roller bodies remaining movable with smooth motion in a simple manner.

The shaped parts that can be inventively used without draft bevels are more simply and advantageously produced than those with draft angles. The thin liquid film arising on the surface of the corresponding parts or elements upon melting enables a removal or ejection by application of only a slight pressure or draw. The wear on the surface of the encapsulated parts can additionally be reduced, so the service life of the shaped parts or tools can possibly be extended.

Waxes and/or polyolefins and/or substance mixtures can be used as meltable substances. The substances can be homogeneous substances made from a single material, or substances made from a material mixture. A layer design of the meltable coating composed of different substances or materials, possibly melting at different temperatures, is likewise conceivable. Among other things, a slow ejection or a monitored extraction (for example in multiple stages) can thereby be achieved given simultaneous heating.

The method is advantageously implemented with a meltable substance that is chemically resistant to the casting compound, in particular with a substance that does not detach from the element upon the casting and curing of the casting compound. It should thus be assured that the properties of the meltable substance are not negatively influenced by the casting compound surrounding this. In particular the casting compound must not chemically attack the meltable substance or the meltable material. The meltable coating must remain on the element during the casting in the casting compound and during the curing of the casting compound. It may not detach and, for example, intermix with the casting compound, because the gap creation upon melting them would be impaired.

The method is advantageously implemented with a meltable substance whose melting temperature is higher than the maximum temperature occurring in the curing of the casting compound. It is therewith ensured that the coating of the element does not already melt upon curing of the casting compound, but rather only upon subsequent heating when the correspondingly encapsulated element should actually be removed from the module to be produced or when its mobility should be established. A thermal resistance of the substance in the casting process is thus ensured by the selection of a suitable substance.

Moreover, the cured casting compound must be thermally resistant with regard to the melting temperature of the substance so that the cast is not impaired. Alternatively or additionally, the heating in order to melt the substance can ensue locally so that the cast largely remains uninfluenced by the heating procedure.

The method is advantageously implemented with a meltable substance that remains dimensionally stable during the casting of the element in the casting compound. The correct thickness that is required so that the encapsulated body can be removed again afterwards, or so that this is movable in the correct manner without too much or too little play, thus can be established upon the application of the meltable substance. Furthermore, by the use of a dimensionally stable substance a problem-free ejection capability can be ensured since no different gap dimensions can occur, for instance due to a change of the distribution of the meltable substance on the element in the encapsulation process relative to the original application on the element.

A meltable substance with a low viscosity can be used for the method. Such a substance exhibits good fluidity and thus enables a problem-free movement of the encapsulated element or its easy extraction after the heating of the coating.

According to the invention the meltable substance can be melted by at least one heating cartridge integrated into the element and/or external to said element; and/or one likewise integrated or external heating rod; and/or by heating with a heat transfer medium, in particular water and/or hot air; and/or by inductive coupling.

The heating cartridges or heating rods are advantageously integrated directly into the encapsulated element so that these do not disturb the encapsulation process. The actual heating can subsequently be effected by corresponding feed lines that lead to the encapsulated element in order to melt the coating of the element. External heating cartridges or heating rods in proximity to the encapsulated element can alternatively be used as long as these are spatially arranged close enough so that sufficient heating of the meltable coating can occur.

It is likewise possible to combine various heating methods with one another, for example with regard to a number of elements to be ejected or different regions of the elements to be ejected.

Heating by means of inductive coupling is particularly advantageous since this can ensue without further feed lines or without contact.

Heat transfer media such as water or hot air can be supplied to the element or the region of the element coating via suitable conduits for the introduction of the heat.

In the case of heating with a heat transfer medium, the heat transfer medium or media can be conducted in at least one channel integrated into the element and/or external. Such a channel or an arrangement of a number of such channels can be integrated into the element or the elements. A closed embodiment or an embodiment open to the surface with the meltable coating are both possible. In addition, it is likewise possible to provide external channels at the element coating or in proximity with regard to the encapsulated element, in which external channels the heat transfer medium is conducted.

Given heating by heating elements such as heating rods or the like in which a feed line is required, this can be directed through the open region that must be preset anyway, that serves for the removal of the cast element or its movement. Feed lines for heating devices that can be realized without the module ultimately to be produced being impaired or altered in an unwanted or disadvantageous manner.

The element can be coated with the meltable substance in a thickness in the sub-millimeter range, in particular in a thickness of approximately 0.1 mm. The thickness that is required in order to remove the cast-in element or to ensure its mobility in the desired manner is decisive for the selection of the thickness of the coating. The correct thickness depends, for example, on the viscosity of the meltable substance. It is must be attended to that the gap arising upon melting is neither too small (whereby removal could possibly be impaired) nor too large (whereby, for example, a precise guidance of a provided could be impaired). Depending on the application, thicknesses of one hundredth of a millimeter up to approximately one millimeter can be suitable. Inevitably-occurring deviations from the provided thickness should be taken into account in the application of the coating.

The heating in order to bring the substance to melting can ensue locally. Such a local heating, for example using a locally situated heating rod, has the advantage that no further components of the module to be created can be detrimentally affected by the procedure of the heating. The actual required temperature for the melting procedure can be generated in a targeted manner. Care should be taken that only the element or the substance and a small surrounding region are heated so that the coating composed of the meltable substance is melted. The surrounding region is thereby not detrimentally affected. Furthermore, a local heating affords the possibility to (initially) bring only specific points of the coating to the melting point, for example to achieve a partial mobility.

After the heating the element can be pushed out or drawn out from the casting compound. The coating completely surrounds the element in the normal case, so a defined gap is ensured after the melting of the coating, and thus the pressure or draw that is to be applied for ejection is reduced relative to conventional methods. This enables the production of the module for the medical apparatus to possibly be realized with less powerful (and therewith more advantageous) machines for the draw or pressure power to be applied. The heating for the melting of the coating from the meltable substance represents no further limitation or detrimental effect for the quality and functionality of the medical module to be produced since temperatures of approximately 120° C. must already be tolerated in the casting with the casting compound.

With the inventive method the removability or, respectively, mobility of at least one element encapsulated in a casting compound in a medical apparatus can thus be ensured, or a module can be produced using such cast-in elements without the need for conventional specific arrangements (such as, for example, draft bevels), that can impair the geometry not only of the encapsulated elements but rather also of the entire module to be produced with their assistance.

A geometrically more precise structure (which is important, for example, for the manufacture of gradient coils) is in particular enabled.

BRIEF DESCRIPTION OF THE DRAWINGS

FIG. 1 is a flowchart for production of a module for a medical apparatus according to the inventive method.

FIG. 2 illustrates how the removability of a casting mandrel for a gradient coil is achieved according to the inventive method.

DESCRIPTION OF THE PREFERRED EMBODIMENTS

Figure 3:
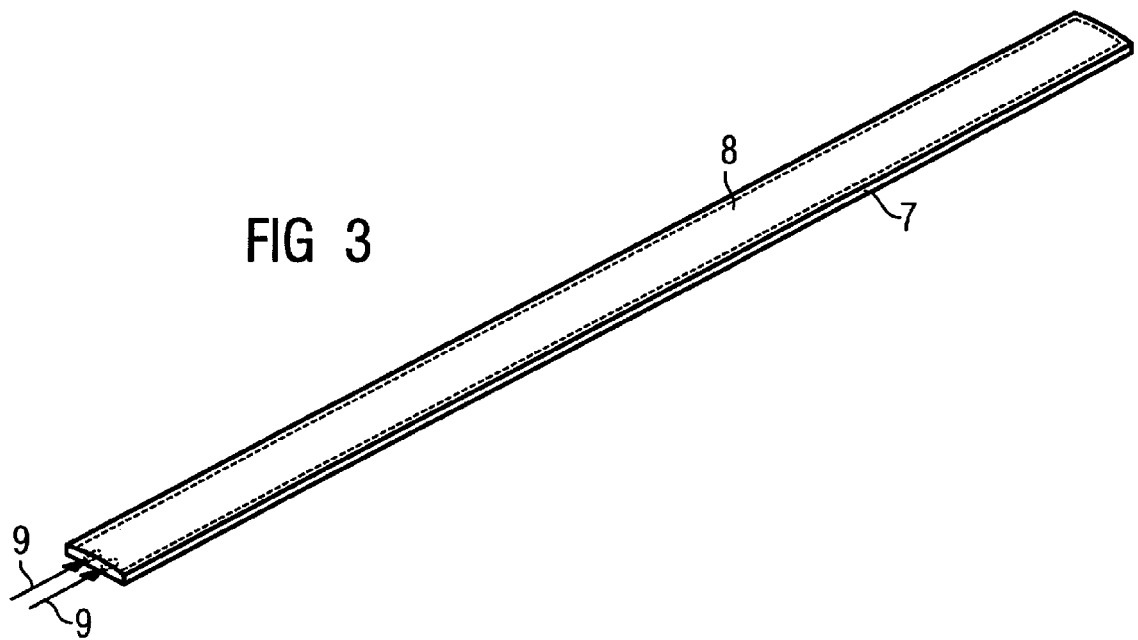
FIG. 3 illustrates the application of an inventive method for casting a shim core.

Steps to produce a module for a medical apparatus with an inventive method are presented in FIG. 1 in a flowchart.

In step (a) the element whose removability or, respectively, mobility must be ensured is initially coated with a substance meltable at a suitable temperature, in particular a wax-like substance or a polyolefin.

The meltable substance is chemically resistant to the casting compound and melts at a temperature that is higher than the maximum temperature occurring upon curing of the casting compound.

According to the step (b), to create a module of a medical apparatus the element so coated with a meltable substance is encapsulated in a casting compound together with the remaining module components such as, for example, a gradient coil constructed as an element on the casting mandrel.

According to the step (c), after the curing of the casting compound the meltable substance is heated, for which heating rods or, respectively, heating cartridges; heat transfer media that are conducted in channels; or even inductive heating methods can be used.

The step (c2) optionally follows the step of the heating in the event that the element (such as, for example, a casting mandrel for a gradient coil) should not remain in the finished module but rather should be removed again. Using suitable draw or pressure machines, the element is thus removed from the module with the aid of the gap arising at the casting compound due to the heating of the meltable substance. Due to the gap only a comparably slight force is required for the removal, Finally, according to step (d) the finished module results which is constructed with geometric precision due to the simple removability or, respectively, simple assurance of a mobility of the element by means of the meltable coating.

In the event that no extraction of the cast-in element is required (for example given roller bodies), the optional step (c2) is omitted. In this case the module is ready for use immediately after the heating of the substance and the melting procedure that is hereby initiated.

The application of an inventive method given a casting mandrel 1 of a gradient coil is shown in FIG. 2. The casting mandrel 1 is cylindrically designed, wherein a geometrical design that is exact to the greatest possible extent is required for the error-free functionality of the gradient coil to be constructed on the mandrel.

As stated the casting mandrel 1 serves for the construction of a cylindrical gradient coil whose windings here are indicated by the arrows 2. The casting mandrel 1 is coated with a meltable substance 3, whereby the coating exhibits a thickness in the sub-millimeter range. The casting mandrel 1 is encapsulated overall in a casting compound 4 (depicted here merely by indication), whereby to one side an accessibility from the outside is ensured so that the casting mandrel 1 can be removed again after the construction or the production of the medical apparatus (thus here the magnetic resonance apparatus).

After the curing of the casting compound 4, the meltable substance 3 is heated to remove the casting mandrel 1, which presently occurs via inductive coupling of an alternating current field as it is indicated hereby the arrows 5. The inductive heating offers the advantage that the supplied heat can be precisely dosed and the heating can ensue comparably quickly without the regions to be heated all having to be accessible from the outside. In this case the meltable substance 3 substantially surrounded by the casting compound 4 is thus melted from the outside.

If the meltable substance 3 is melted to start, due to the arising gap between the casting compound 4 and the casting mandrel 1 a problem-free removal of the casting mandrel 1 is thus possible with only a slight draw, as it is indicated here by the arrow 6. A deviation of the casting mandrel 1 from the ideal cylindrical shape can be avoided via the omission of draft angles in the cylindrical casting mandrel 1, which is enabled by the application of the meltable substance.

The application of an inventive method given a shim core 7 is indicated in FIG. 3. Devices in order to arrange further coils or, respectively, materials that merely serve for the shielding (shimming) in order to thus achieve the desired homogeneity or, respectively, composition of the magnetic field without disruptions of the field curve occurring are provided at the coil arrangements in magnetic resonance devices. The shim core 7 to generate such a design for magnetic field correction is provided with a meltable coating made from a meltable substance 8, whereby the cast is enabled in a casting compound (which is not shown in detail here) given a simultaneous removability. The shim core 7 is heated via thin channels via which a heat transfer medium is directed through the shim core 7, as is indicated by the arrows 9.

Upon heating with the aid of the channels the meltable substance 8 melts and a gap arises relative to the surrounding casting compound, such that the shim core 7 (which comprises metal) is mobile relative to and can be withdrawn from said casting compound.

Figure 4:
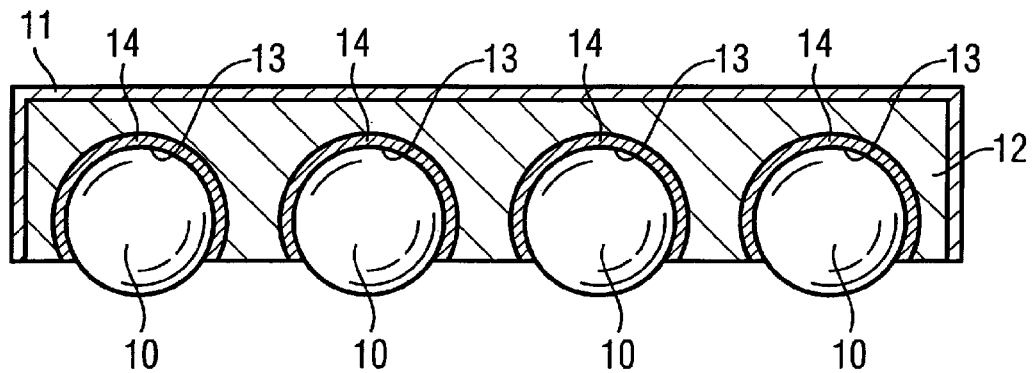
FIG. 4 illustrates the application of the inventive method for a roller body for a medical apparatus.

Finally, the application of an inventive method given a roller body for the transport or the installation of a gradient coil is presented in FIG. 4.

Various roller bodies 10 that serve for the transport of a module to be attached on the housing 11 are presently extant as rollers. The housing 11 is filled with a casting compound 12 that exhibits recesses 13 adapted to the shape of the roller bodies 10 in the region of the roller bodies 10. The roller bodies 10 are presently covered with a meltable substance 14 (here a wax) in the region of the recesses 13, which substance 14 is subsequently melted via a heating with the aid of heating rods (not shown) after the casting compound 12 is finally cured. In other embodiments (not shown), the meltable substance 14 can also completely surround the roller bodies 10.

After the melting of the meltable substance 14 via the process of the heating, a gap arises between the roller bodies 10 and the casting compound 12, whereby the mobility of the roller bodies 10 relative to the bearing formed by the casting compound 12 as well as the housing 11 is ensured. Due to the meltable coating of the roller bodies 10, these acquire a smooth-running mobility caused by the low roll resistance between the roller bodies 10 and the casting compound 12 after the melting procedure. An insert coil can be locally positioned in a simple manner.

According to the invention, a mobility of elements encapsulated in a casting compound can thus be ensured without greater effort, be it the case of roller bodies or other application fields in connection with medical apparatuses. Elements that are encapsulated first in order to then be removed again must exhibit no specific shape with draft angles or the like ensuring the removability in order to be able to effect a simple and cost-effective extraction. Modules for medical apparatuses can therewith be generated significantly more simply than before. Limitations in the precision of the geometric design no longer have to be accepted. Although modifications and changes may be suggested by those skilled in the art, it is the intention of the inventors to embody within the patent warranted hereon all changes and modifications as reasonably and properly come within the scope of their contribution to the art.

We claim as our invention:

1. A method for casting an element in a casting compound in a module of a medical apparatus, comprising the steps of:
    coating at least a portion of an element with a meltable substance to produce a coated element;
    casting the element coated with the meltable substance by surrounding at least a said portion of said coated element with casting compound with said casting compound in contact with said meltable substance, to form a module of a medical apparatus; and
    after at least partial curing of said casting compound to form a cast element, applying heat to the meltable substance to melt the meltable substance to produce a separation between said element and said cast element that makes said element moveable relative to said cast element.

2. A method as claimed in claim 1 comprising casting said element to form a gradient coil of a magnetic resonance apparatus.

3. A method as claimed in claim 1 comprising casting said element in a casting compound comprised of a resin matrix.

4. A method as claimed in claim 3 wherein said cast element is a gradient coil arrangement of a magnetic resonance apparatus that is surrounded by said resin matrix.

5. A method as claimed in claim 1 wherein said cast element is a shaped part of said module of said medical apparatus.

6. A method as claimed in claim 1 wherein said element is a roller body of said module of said medical apparatus and wherein said cast element is a bearing for said roller body.

7. A method as claimed in claim 1 wherein said element is selected from the group consisting of a mandrel for producing a magnetic resonance coil, a magnetic resonance shim core, a profile rod, and a roller body for an insert gradient coil.

8. A method as claimed in claim 1 comprising selecting said meltable substance from the group consisting of waxes, polyolefins, and mixtures of waxes and polyolefins.

9. A method as claimed in claim 1 comprising employing a meltable substance that is chemically resistant to said casting compound to preclude detachment of said meltable substance from said coated element during casting and curing of said casting compound.

10. A method as claimed in claim 1 comprising employing a meltable substance having a melting temperature that is higher than a maximum temperature that occurs during curing of said casting compound.

11. A method as claimed in claim 1 comprising employing a meltable substance that remains dimensionally stable during casting of said element in said casting compound.

12. A method as claimed in claim 1 comprising employing a meltable substance with a low viscosity.

13. A method as claimed in claim 1 comprising applying heat to said meltable substance to melt said meltable substance by a heating arrangement selected from the group consisting of a heating cartridge integrated into the element, a heating cartridge external to the element, a heating rod, a heat transfer medium, and an inductive coupling arrangement.

14. A method as claimed in claim 1 comprising applying heat to said meltable substance to melt said meltable substance via a heat transfer medium conducted in a channel integrated into the element.

15. A method as claimed in claim 1 comprising applying heat to said meltable substance to melt said meltable substance via a heat transfer medium conducted in a channel external to the element.

16. A method as claimed in claim 1 comprising coating said element with said meltable substance in a thickness that is less than 1 mm to produce said coated element.

17. A method as claimed in claim 16 comprising coating said element with said meltable substance in a thickness of approximately 0.1 mm to produce said coated element.

18. A method as claimed in claim 1 comprising applying heat only to a local region of said coated element to melt said meltable substance.

19. A method as claimed in claim 1 comprising after melting said meltable substance, removing said element from the cast element by applying a force to said element to push said element from the cast element or to draw said element out of the cast element.

* * * * *